United States Patent [19]

Fukuda et al.

[11] Patent Number: 4,890,370
[45] Date of Patent: Jan. 2, 1990

[54] MANUFACTURING METHOD FOR INTEGRATED RESONATOR

[75] Inventors: Susumu Fukuda, Osaka; Hisashi Ariyoshi, Tokyo; Toru Kasanami, Kyoto, all of Japan

[73] Assignee: Murata Manufacturing Co., Ltd., Japan

[21] Appl. No.: 255,054

[22] Filed: Oct. 7, 1988

[30] Foreign Application Priority Data

Oct. 9, 1987 [JP] Japan .................................. 62-255851

[51] Int. Cl.$^4$ ............................................. H01L 41/22
[52] U.S. Cl. .................................... 29/25.35; 156/651; 310/320; 427/100; 437/54; 437/228
[58] Field of Search ............... 29/25.35; 310/320, 321, 310/348; 437/54, 228, 238; 427/100; 156/651

[56] References Cited

U.S. PATENT DOCUMENTS 3,912,563 10/1975 Tomioka et al. .................... 156/627
4,556,812 12/1985 Kline et al. ..................... 310/320 X Primary Examiner—Carl E. Hall
Attorney, Agent, or Firm—Ostrolenk, Faber, Gerb & Soffen

[57] ABSTRACT

A manufacturing method for an integrated resonator is disclosed wherein a mass of O+ ions are implanted into a silicon monocrystal substrate from one side thereof, a buried SiO$_2$ layer is formed by annealing the ion implanted substrate, an SiO$_2$ layer is formed on the surface of the substrate by oxidizing it, at least one slit is formed on the SiO$_2$ layer for etching a predetermined area of the silicon monocrystal layer sandwich between two SiO$_2$ layers to form a cavity and, a piezo-electric resonator is formed on an area of the surfacial SiO$_2$ layer corresponding to the cavity in the substrate.

1 Claim, 4 Drawing Sheets

MANUFACTURING METHOD FOR INTEGRATED RESONATOR

BACKGROUND OF THE INVENTION

1. Field of the Invention

The present invention relates to a manufacturing method for an integrated resonator wherein a piezo-electric thin film resonator is formed integrated together with other functional devices on a silicon monocrystal substrate.

2. Description of the Prior Art

In a conventional bulk wave resonator which utilizes the primary thickness vibration of a piezo-electric substrate such as a ceramic substrate or a crystal substrate, the applicable resonance frequency is limited to a frequency of order of several tens MHz since this type of the substrate is impossible to make the thickness thereof thinner than several tens $\mu$m because of restrictions in the processing technique and/or the mechanical strength thereof.

In order to avoid this limitation, the piezo-electric thin film resonator of so called diaphragm type has been developed which is able to manufacture with use of the production technique for semiconductor and can actuate in an ultrahigh frequency zone such as VHF or UHF.

As shown in FIGS. 4 and 5, in a conventional production method for the diaphragm type of piezo-electric resonator, at first, a P+ silicon layer 2 is formed on a surface of a silicon monocrystal substrate 1 and an oxidized silicon thin film 3 is formed on the P+ silicon layer 2. On the oxidized silicon thin film 3, first electrode 4, a piezo-electric thin film 5 of ZnO and a second electrode 6 are formed in a stacked state. Thereafter, the substrate 1 is etched anisotropically from the other surface thereof to form a hole 7 for allowing the thickness vibration of the piezo-electric thin film 5.

However, this manufacturing method has various disadvantages as follows;

First of all, it is difficult to integrate the above piezo-electric thin film resonator on the silicon monocrystal substrate 1 together with other functional devices. Namely, this method needs an extraordinal process for forming the hole from the bottom surface of the substrate which is not included in the ordinal production method for an integrated circuit and, therefore, the existing production line equipment for the semiconductor is not available for the manufacture of this type of piezo-electric thin film resonator.

Further, it is difficult to control the thickness of the P+ silicon layer 2 on which the piezo-electric thin film 5 is to be formed; devices formed on the substrate are damaged in the etching process which needs a relatively long time; the size of this type piezo-electric resonator becomes inevitably large since an area necessary for etching is impossible to minimize because of the anisotropic etching; the other surface of the substrate cannot be utilized for forming devices; and it becomes necessary to set the etching area so as to correspond to the piezo-electric resonator with use of the photo-lithographic technique.

In order to solve these problems, there is proposed a piezo-electric thin film resonator of ZnO having a structure as shown in FIG. 6.

Upon production thereof, an SiO$_2$ layer 12, insulating layers 13 and 14 and a passivation layer are formed on a silicon substrate 11 in a stacked state. On the passivation layer 15, a thin film 16 of ZnO is formed as a dummy layer to be etched. Further, an SiO$_2$ layer 17, a ZnO layer 18 and an SiO$_2$ layer 19 are stacked on the ZnO thin film 16. Thereafter, the ZnO thin film 16 is etched from a side thereof with use of hydrochloric acid to form a gap 21. Further, Au/Ti electrodes 22 and 23 are formed on both of surfaces of the ZnO layer 18. Thus, a ZnO piezo-electric resonator of diaphragm type is formed above the gap 21.

However, in this structure, the height of the resonator becomes higher than those of other devices to be integrated on the substrate since it is formed above the gap 21. This invites differences in the height between the resonator and other devices, which causes bad affections upon forming other functional devices by preventing a mask from contacting to areas for other devices to be formed.

SUMMARY OF THE INVENTION

An object of the present invention is to provide a piezo-electric resonator formed integrated with other devices on a silicon substrate without having any gap in the height between other devices.

Another object of the present invention is to provide a manufacturing method for forming a piezo-electric resonator which is compatible to the known production method for the semiconductor.

In order to accomplish these objects, according to the present invention, there is provided a manufacturing method for an integrated resonator comprising the following steps: (a) step for implanting O$^+$ ions into a silicon monocrystal substrate from one side thereof; (b) step for annealing the ion implanted substrate to form a buried SiO$_2$ layer therein; (c) step for oxidizing the surface of the substrate to form an SiO$_2$ layer thereon; (d) step for forming at least one slit on the SiO$_2$ layer formed by the step (c); (e) step for etching an area of the silicon monocrystal layer defined between the SiO$_2$ layer and the buried SiO$_2$ layer through the at least one slit to form a cavity therein; and (f) step for forming a piezo-electric resonator on an area of the SiO$_2$ layer corresponding to the cavity formed by etching.

Also, there is provided a piezo-electric resonator formed integrated on a monocrystalline silicon substrate including: a buried SiO$_2$ layer formed in the substrate at a predetermined depth from one surface of the substrate; an SiO$_2$ layer formed on the surface of the substrate; a silicon monocrystal layer defined between the buried SiO$_2$ layer and the SiO$_2$ layer, said silicon monocrystal layer having a cavity formed between the two SiO$_2$ layers; and a piezo-electric resonator element formed on an area of the SiO$_2$ layer corresponding to the cavity.

According to the present invention, a buried SiO$_2$ layer is formed in a silicon monocrystal substrate and a cavity is formed just on the buried SiO$_2$ layer. Therefore, a piezo-electric thin film resonator can be formed just on the substrate. This can minimize the height of the resonator.

Further, according to the present invention, the existing production line equipment is applicable to the present manufacturing method directly without changing it.

Also, in the present invention, the buried SiO$_2$ layer can serve as an insulating layer between the substrate and functional devices formed thereon and, accordingly, the isolation between them is improved.

BRIEF DESCRIPTION OF DRAWINGS

These and other objects and features of the present invention will become more apparent when the preferred embodiment of the present invention is described in detail with reference of accompanied drawings in that.

DETAILED DESCRIPTION OF THE PREFERRED EMBODIMENT

FIGS. 1(a) to 1(e) show respective steps for manufacturing a piezo-electric resonator of diaphragm type according to the present invention.

At first, a silicon monocrystal substrate 31 is prepared as a substrate for an integrated resonator.

Figure 1A:
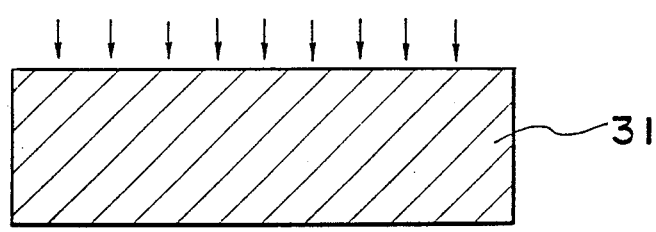
FIGS. 1(a), 1(b), 1(c), 1(d) and 1(e) are sectional views for showing steps of the manufacturing method for an integrated piezo-electric resonator according to the present invention.

As shown in FIG. 1(a), a mass of O+ ions are implanted into the substrate 31 from one surface thereof with use of the ion implanting method.

Figure 1B:
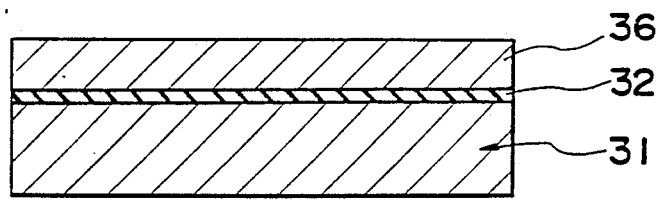

Thereafter, the substrate 31 is annealed to form a buried SiO2 layer 32 therein as shown in FIG. 1(b). This technique for forming a buried SiO2 layer is well known as SIMOX (Separation by Implanted Oxygen) technique.

Figure 1C:
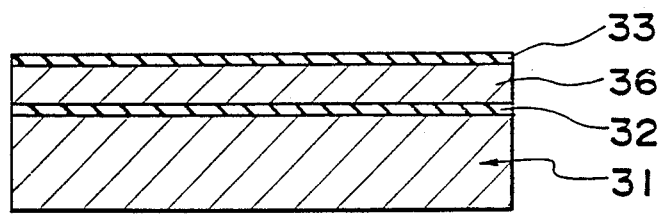

Then, an SiO2 layer 33 is formed on the surface of the substrate by oxidizing it as shown in FIG. 1(c).

Figure 2A:
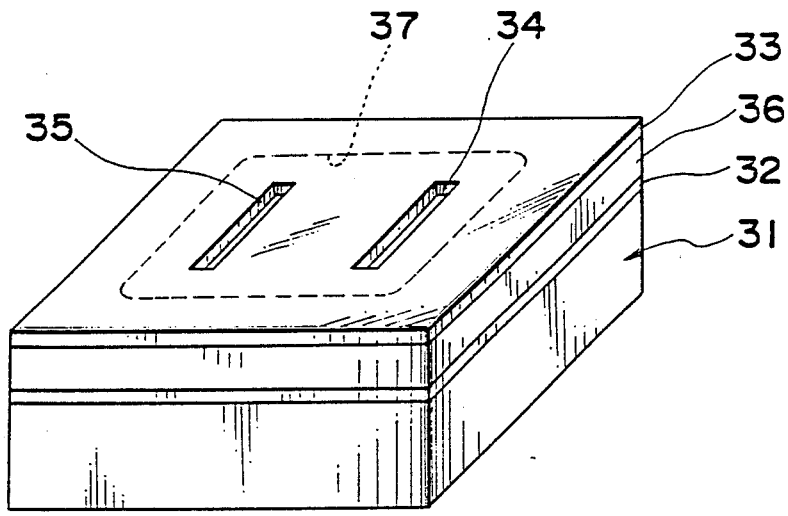
FIGS. 2(a) and 2(b) are perspective views showing methods for forming a cavity for the resonator, respectively.

After forming the SiO2 layer 33 on the substrate 31, slits 34 and 35 are formed on the SiO2 layer 33 by etching so as to attain to the upper surface of the silicon monocrystal layer 36 sandwich between two SiO2 layers 32 and 33, as shown in FIG. 2(a). These slits 34 and 35 are provided for etching a square area 37 of the silicon monocrystal layer 36 as indicated by a dotted line in FIG. 2(a). Each slit is formed to have a width of several μm in order for etching an area of the silicon monocrystal layer 36.

Figure 1D:
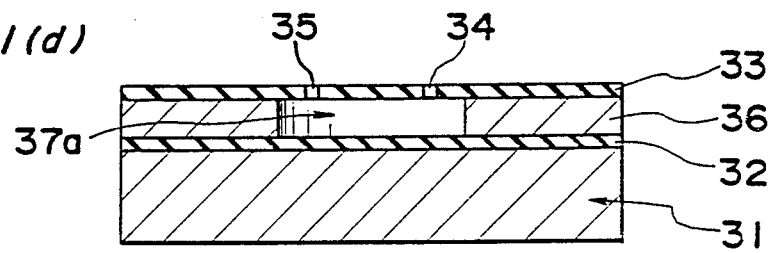
Figure 1E:
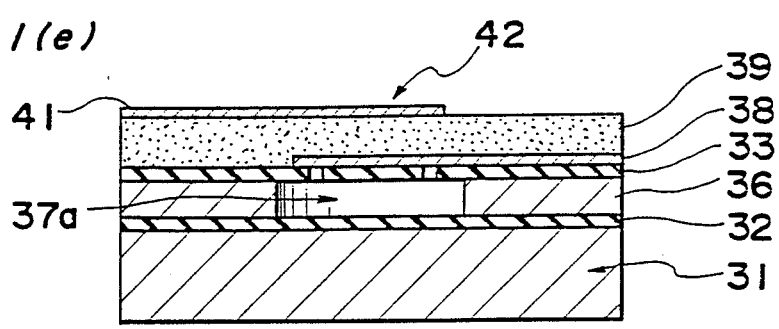

As shown in FIG. 1(d), the square area 37 is etched through these slits 34 and 35 to form a cavity 37a between two SiO2 layers 32 and 33.

Then, an electrode 38 is formed on the SiO2 layer 33 and, further, a thin film 39 of a piezo-electric material such as ZnO is formed thereon. On the piezo-electric thin film 39, another electrode 41 is formed so as to oppose the electrode 38.

Thus, a piezo-electric resonator 42 of diaphragm type is formed above the cavity 37a supported by the SiO2 layer 33.

It is to be noted that the two etching slits 34 and 35 do not affect the vibration mode of the resonator formed thereon since the width of the etching slit is very narrow when compared with the thickness of the resonator. However, it is desirable to form the resonator on an area defined between the two etching slits 34 and 35 in order to avoid affections due to these slits perfectly.

As is apparent from the above, processes for manufacturing the piezo-electric resonator are done only from one side of the substrate and, accordingly, it can be made with use of an ordinal production equipment for semiconductor. Also, it becomes possible to form the cavity without using a resolvable material such as ZnO. Accordingly, the present manufacturing method is suitable for integrating the diaphragm type piezo-electric resonator together with other functional devices on a silicon substrate. Also, the height of a piezo-electric resonator becomes fitted to those of other integrated devices since the cavity 37a is formed in the silicon monocrystal substrate 31.

Figure 2B:
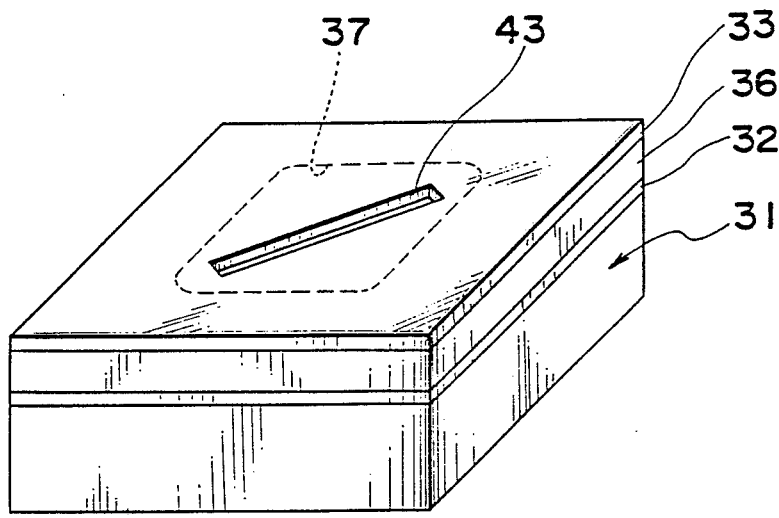

It is also possible to form a cavity in the silicon substrate by forming one slit 43 on the SiO2 layer 32 in a proper direction, as shown in FIG. 2(b). In this case, a square area 37' having a diagonal which coincides with the slit 43 is etched to form a cavity in the SiO2 layer 36.

Figure 3A:
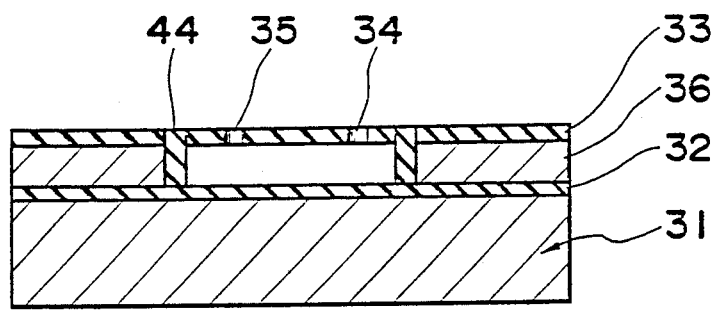
FIGS. 3(b) and 3(c) are sectional views showing a variation of the manufacturing method shown in FIG. 1.
Figure 3B:
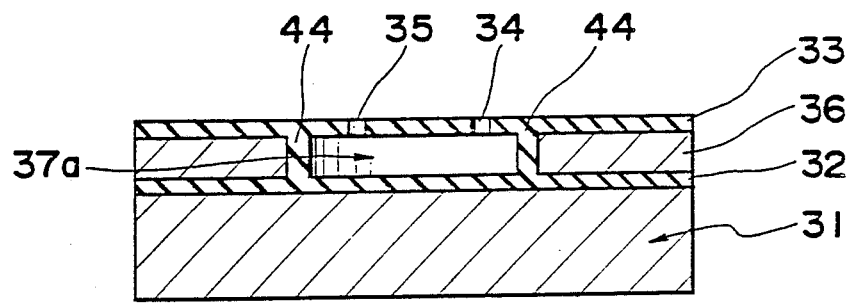
Figure 3C:
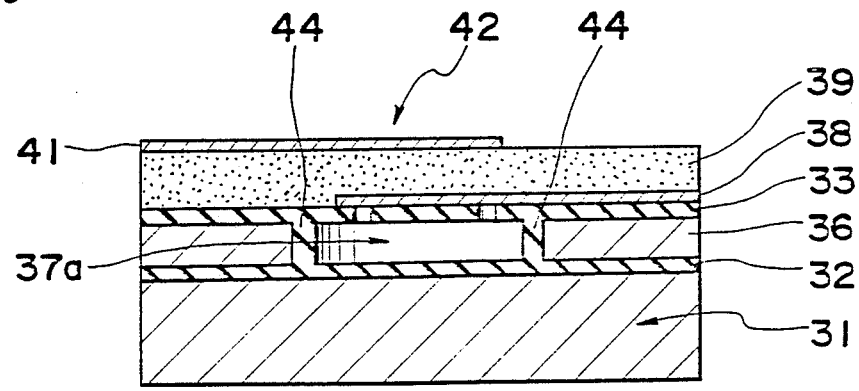
Figure 4:
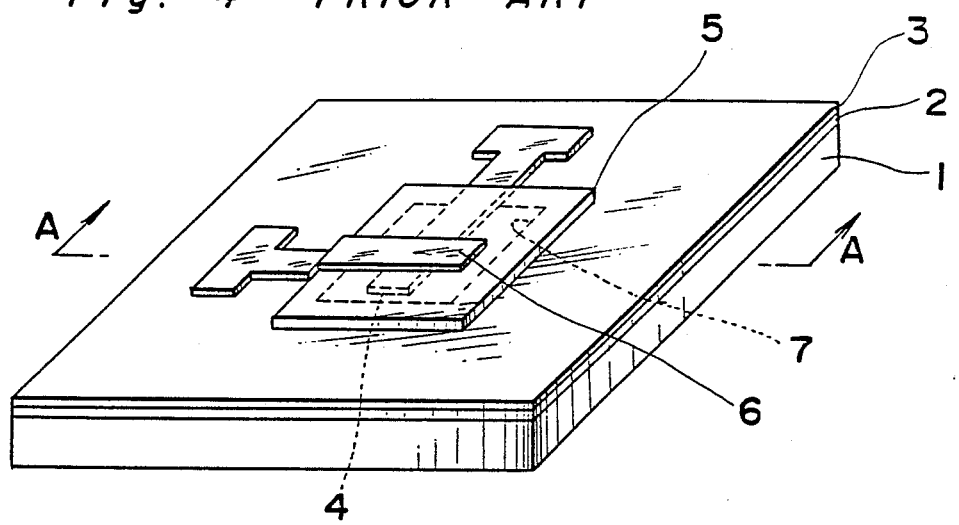
FIG. 4 is a perspective view showing a conventional diaphragm type of piezo-electric resonator.
Figure 5:
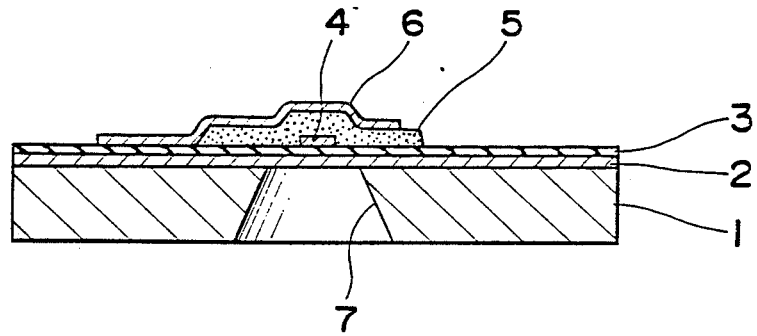
FIG. 5 is a cross-sectional view along a line A—A shown in FIG. 4.
Figure 6:
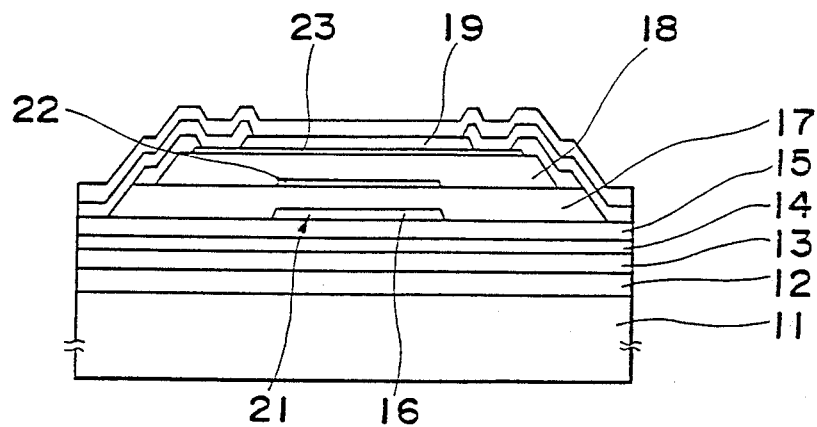
FIG. 6 is a cross-sectional view of another conventional diaphragm type of piezo-electric resonator.

FIGS. 3(a), 3(b) and 3(c) show a variation of the preferred embodiment of the present invention shown in FIGS. 1(a) to 1(e).

This variation is performed successively after the step shown in FIG. 1(c).

As shown in FIG. 3(a), a square frame 44 is formed for defining an area to be etched. This frame 44 can be formed by oxidizing the silicon layer 36 partially with use of the LOCOS (Local Oxidation of Silicon) method.

Then, the area surrounded by the frame 44 and between two SiO2 layers 32 and 33 is etched through the etching slits 34 and 35 (or the slit 43) to form a cavity 37a, as shown in FIG. 3(b).

And, as shown in FIG. 3(c), a piezo-electric resonator of diaphragm type is formed above the cavity 37a which is comprised of two electrodes 38 and 41 and a ZnO layer 39.

According to this variation, the cavity 37a is formed accurately since the SiO2 frame 44 has a role of stopper against etching.

If it becomes necessary to obtain a cavity having a larger thickness, the monocrystalline silicon layer 36 is grown with use of the epitaxial growth method after forming the buried SiO2 layer 32.

The preferred embodiments described herein are illustrative and not restrictive, the scope of the invention being indicated by the appended claims and all variations which come within the meanings of the claims are intended to be embraced herein.

What is claimed is:

1. A manufacturing method for an integrated resonator comprising the following steps:
   (a) implanting O+ ions into a silicon monocrystal substrate from one side thereof,
   (b) annealing the ion implanted substrate to form a buried SiO2 layer therein,
   (c) oxidizing the surface of the substrate to form an SiO2 layer thereon,
   (d) forming at least one slit on the SiO2 layer formed by step (c),
   (e) etching an area of the silicon monocrystal layer defined between the SiO2 layer and the buried SiO2 layer through the at least one slit to form a cavity therein, and
   (f) forming a piezo-electric resonator on an area of the SiO2 layer corresponding to the cavity formed by etching.

* * * * *